(12) United States Patent
Bauer et al.

(10) Patent No.: US 8,659,135 B2
(45) Date of Patent: Feb. 25, 2014

(54) SEMICONDUCTOR DEVICE STACK AND METHOD FOR ITS PRODUCTION

(75) Inventors: Michael Bauer, Nittendorf (DE); Ulrich Bachmaier, Ruderting (DE); Robert-Christian Hagen, Sarching (DE); Jens Pohl, Bernhardswald (DE); Rainer Steiner, Regensburg (DE); Hermann Vllsmeler, Karlsfeld (DE); Holger Woerner, Regensburg (DE); Bernhard Zuhr, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 651 days.

(21) Appl. No.: 11/572,873

(22) PCT Filed: Jul. 21, 2005

(86) PCT No.: PCT/DE2005/001295
§ 371 (c)(1),
(2), (4) Date: Aug. 22, 2007

(87) PCT Pub. No.: WO2006/012846
PCT Pub. Date: Feb. 9, 2006

(65) Prior Publication Data
US 2007/0278639 A1    Dec. 6, 2007

(30) Foreign Application Priority Data
Jul. 29, 2004   (DE) .......................... 10 2004 036 909

(51) Int. Cl.
*H01L 23/488*    (2006.01)
(52) U.S. Cl.
USPC .................. 257/686; 257/693; 257/E23.043; 257/E25.027

(58) Field of Classification Search
USPC .......... 257/693, E25.027, E21.614, 685, 686, 257/700, 730, 777, E23.031, E23.039, 257/E23.043
See application file for complete search history.

(56) References Cited

U.S. PATENT DOCUMENTS

| 6,060,150 | A  | * | 5/2000  | Nakatani et al. | 428/209 |
| 6,225,694 | B1 | * | 5/2001  | Terui           | 257/704 |
| 6,291,259 | B1 |   | 9/2001  | Chun            |         |
| 6,313,522 | B1 |   | 11/2001 | Akram et al.    |         |

(Continued)

FOREIGN PATENT DOCUMENTS

| DE | 198 45 316 A1 | 2/1999 |
| DE | 101 42 117 A1 | 3/2003 |
| DE | 101 38 278 C1 | 4/2003 |
| EP | 0 818 822 B1  | 4/2002 |

*Primary Examiner* — Wensing Kuo
(74) *Attorney, Agent, or Firm* — Dicke, Billig & Czaja, PLLC

(57) ABSTRACT

A semiconductor stack and a semiconductor base device with a wiring substrate and an intermediate wiring board for a semiconductor device stack is disclosed. In one embodiment, a semiconductor chip is arranged between the intermediate wiring board and the wiring substrate, which is electrically connected by way of the wiring substrate on the one hand to external contacts on the underside of the wiring substrate and on the other hand to contact terminal areas in the edge regions of the wiring substrate. The intermediate wiring board has angled-away external flat conductors, which are electrically connected in the contact terminal areas of the wiring board. Furthermore, on the upper side of the intermediate wiring board, arranged on the free ends of the internal flat conductors are external contact terminal areas, which correspond in size and arrangement to external contacts of a semiconductor device to be stacked.

8 Claims, 3 Drawing Sheets

(56) References Cited

U.S. PATENT DOCUMENTS

| | | | |
|---|---|---|---|
| 6,320,250 B1 * | 11/2001 | Takahashi | 257/678 |
| 6,531,784 B1 * | 3/2003 | Shim et al. | 257/777 |
| 6,607,937 B1 * | 8/2003 | Corisis | 438/108 |
| 6,618,267 B1 | 9/2003 | Dalal et al. | |
| 6,865,084 B2 * | 3/2005 | Lin et al. | 361/704 |
| 6,951,982 B2 * | 10/2005 | Chye et al. | 174/350 |
| 6,977,431 B1 * | 12/2005 | Oh et al. | 257/696 |
| 2001/0036065 A1 | 11/2001 | Hirano et al. | |
| 2002/0135982 A1 | 9/2002 | Kledzik et al. | |
| 2003/0020154 A1 | 1/2003 | Hashimoto | |
| 2003/0030143 A1 | 2/2003 | Wennemuth et al. | |
| 2003/0042591 A1 * | 3/2003 | Goller et al. | 257/686 |
| 2003/0111736 A1 | 6/2003 | Roeters et al. | |
| 2003/0127721 A1 | 7/2003 | Fukuda et al. | |
| 2003/0197290 A1 * | 10/2003 | Crowley et al. | 257/787 |
| 2004/0026773 A1 * | 2/2004 | Koon et al. | 257/692 |
| 2004/0051170 A1 | 3/2004 | Kawakami et al. | |
| 2004/0145039 A1 | 7/2004 | Shim et al. | |

\* cited by examiner

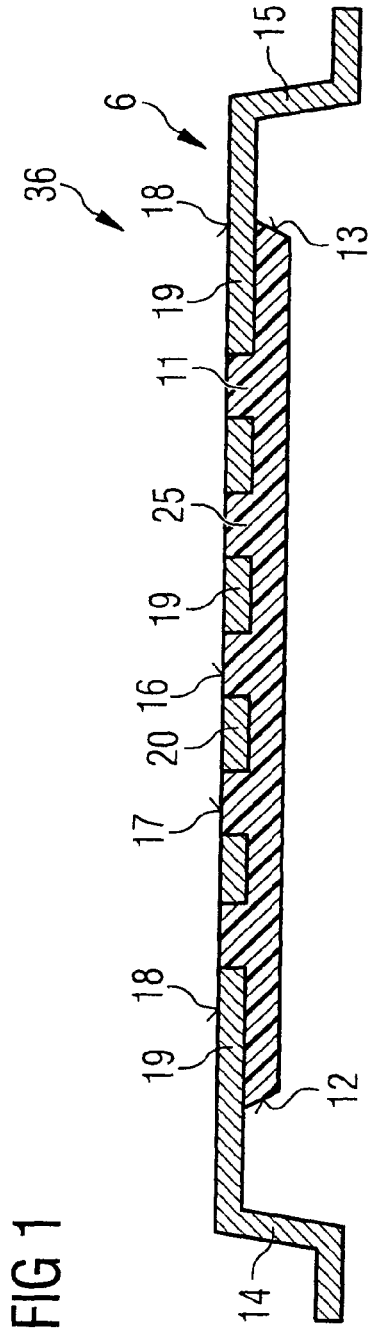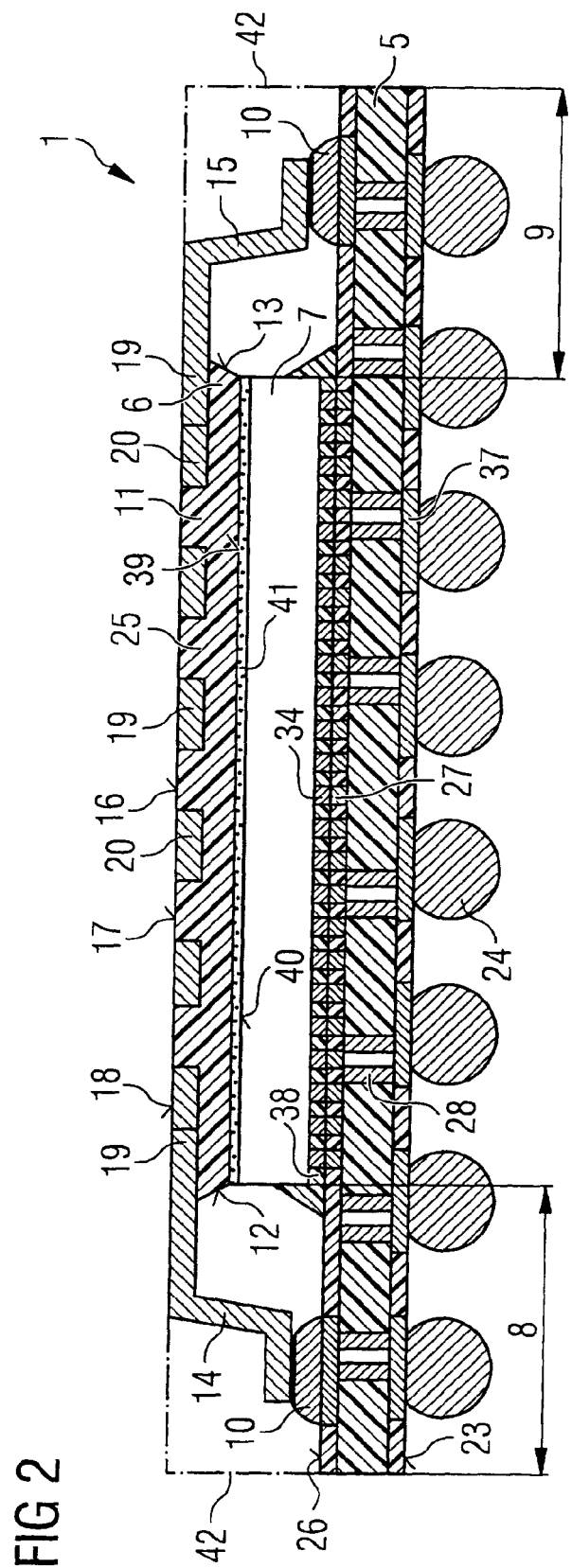

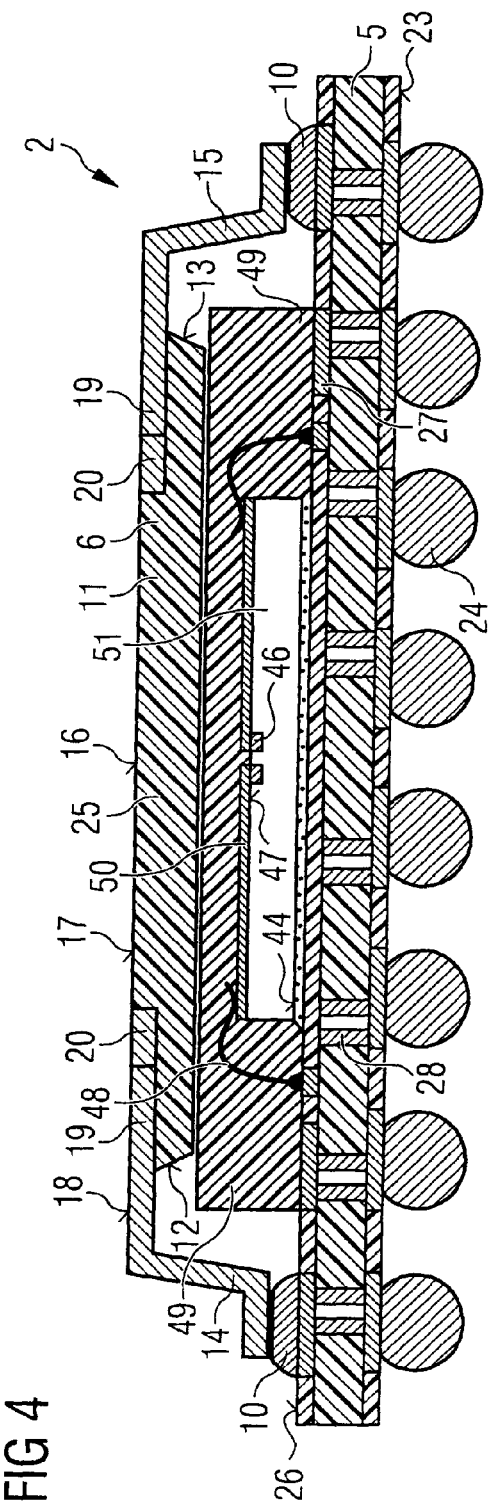
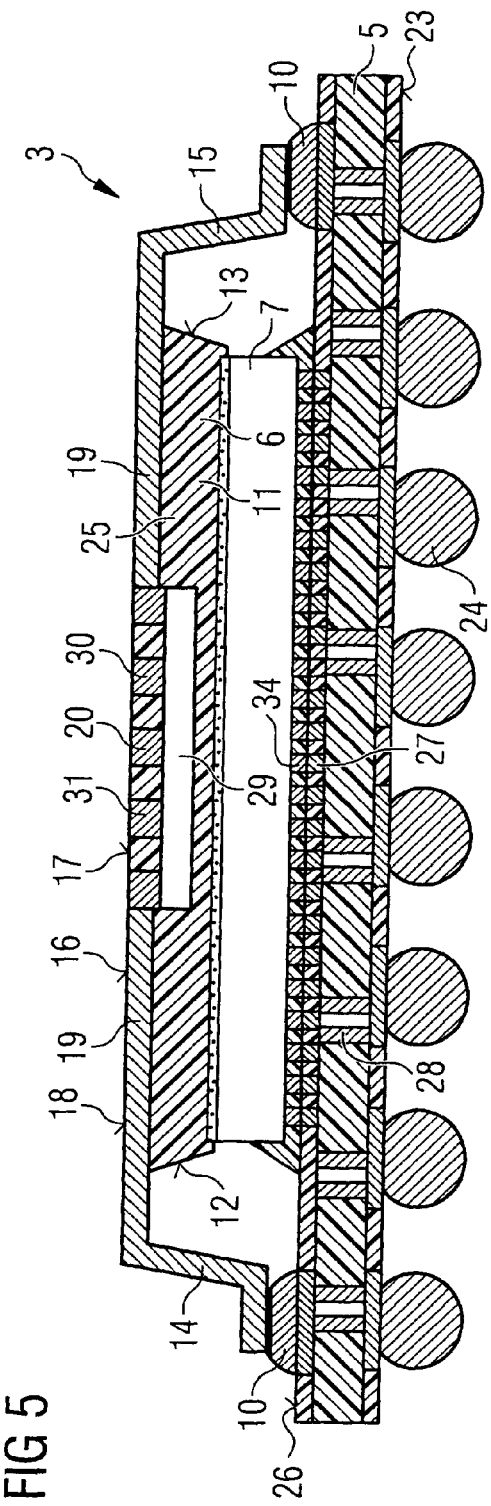
FIG 4
FIG 5

SEMICONDUCTOR DEVICE STACK AND METHOD FOR ITS PRODUCTION

CROSS REFERENCE TO RELATED APPLICATION

This Utility Patent Application claims the benefit of the filing date of German Application No. DE 10 2004 036 909.7, filed Jul. 29, 2004, and International Application No. PCT/DE2005/001295, filed Jul. 21, 2005, both of which are herein incorporated by reference.

BACKGROUND

The invention relates to a semiconductor base device with a wiring substrate and an intermediate wiring board for a semiconductor device stack, and to a method for its production. In particular, the invention relates to a wiring substrate and an intermediate wiring board between which a semiconductor chip is arranged.

In the case of conventional semiconductor devices with a wiring substrate, external contacts are arranged on the underside of the wiring substrate and at least one semiconductor chip, for example a computing element such as a DSP (digital signal processor) or such as a memory device (a DRAM), is arranged on the upper side of the wiring substrate, in the center of the wiring substrate.

If a conventional device of this type is to be used as a stackable semiconductor device for a semiconductor module having stacked semiconductor devices, only the edge regions of the wiring substrate can be available for the attachment of external contacts of a stacked semiconductor device, since the center of the wiring substrate is taken up by the semiconductor chip itself. The number and arrangement of external contacts of the semiconductor device to be stacked is very restricted as a result, so that many known types of package, such as BGA (Ball Grid Array), FBGA (Fine Pitch Ball Grid Array) or LBGA (Large Ball Grid Array) packages, cannot be stacked on a conventional semiconductor device with a wiring substrate, since the solder balls acting as external contacts are arranged such that they are distributed over the entire underside of semiconductor devices of this type.

A solution to this stacking problem is known from the document DE 101 38 278. For stacking, conventional semiconductor devices with a BGA, FBGA or LBGA package are provided with additional flexible wiring films that have a larger surface area than the semiconductor devices to be stacked and protrude beyond the edge of the semiconductor devices, so that they can be bent in the direction of a semiconductor device of a semiconductor device stack that is arranged thereunder or thereabove and can be electrically connected to the semiconductor device arranged thereunder or thereabove by way of the flexible film.

A semiconductor module with semiconductor devices stacked in such a manner has the disadvantage that the semiconductor devices cannot be stacked with the lowest possible space requirement, especially since the bent-over wiring film also requires a minimum bending radius which cannot be any less without the risk of microcracks in the wiring lines arranged on the wiring film. Forming a wiring film from a suitable highly flexible film and leading it from the underside of a semiconductor device over one of the edge sides of the semiconductor device onto the upper side of the semiconductor device, so that external contact areas of the wiring film can be arranged in any distributed manner and connected to one another both on the underside of the semiconductor device and on the upper side of the semiconductor device, is extremely complex and requires cost-intensive production methods.

A semiconductor base device structured in this way additionally has the disadvantage that line paths that are relatively long and also vary in length exist over the film between the semiconductor chip in the lower semiconductor base device package and the stacked semiconductor device arranged on the semiconductor base device, so that in communication applications delay differences and crosstalk in the coupling of radio-frequency signals may occur.

A further variant for stacking semiconductor devices one on top of the other is the possibility of using interposers which have on their upper sides external contact areas that can be arranged in any distributed manner over the entire surface, their size and arrangement corresponding to the size and arrangement of external contacts of a semiconductor device to be stacked. Arranged on the underside of the interposer or of an intermediate connecting part are solder-ball-based 3D contacts, which are of such a large diameter as to allow bridging of the interspace between the interposer and a wiring substrate of a semiconductor device arranged thereunder, with a mounted semiconductor chip, and permit the connection by way of these large-volume 3D contacts between the interposer and the wiring substrate of the semiconductor device arranged thereunder in edge regions of the wiring substrate.

For this purpose, these 3D contacts have a diameter that is greater than the thickness of the semiconductor chip of the semiconductor device arranged thereunder, which has the disadvantage that such 3D contacts of the interposer cannot be arranged as close together as desired on edge regions of the wiring substrate or of the interposer, and consequently have to be disadvantageously arranged with a widely spaced connection pattern. Consequently, an extensive, relatively high pitch has to be provided for an arrangement of such 3D contacts, in order that they do not touch one another. For a semiconductor base package having a wiring substrate and an interposer with 3D contacts, this results in a disadvantageously enlarged base package if an adequate number of electrical connections between the interposer and the wiring substrate are to be ensured in the edge region of the same.

For these and other reasons, there is a need for the present invention.

SUMMARY

One embodiment provides a semiconductor device stack having a semiconductor base device with a wiring substrate, an intermediate wiring board for the semiconductor device stack, a semiconductor chip arranged between the wiring substrate and the intermediate wiring board, electrically in connection with the wiring substrate. One embodiment provides the wiring substrate having contact terminal areas on an upper side and edge regions, the intermediate wiring board being a self-supporting composite board, on the edge sides of which angled-away external flat conductors are arranged, the upper side of the composite board being made up of an upper side of a plastic package molding compound and of upper sides of internal flat conductors, which are aligned in a coplanar manner in relation to one another.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic cross section through an intermediate wiring board with angled-away external flat conductors.

FIG. 2 illustrates a schematic cross section of a semiconductor base device according to a first embodiment of the invention.

FIG. 4 illustrates a schematic cross section of a semiconductor base device according to a second embodiment of the invention.

FIG. 5 illustrates a schematic cross section of a semiconductor base device according to a third embodiment of the invention.

DETAILED DESCRIPTION

Figure 3:
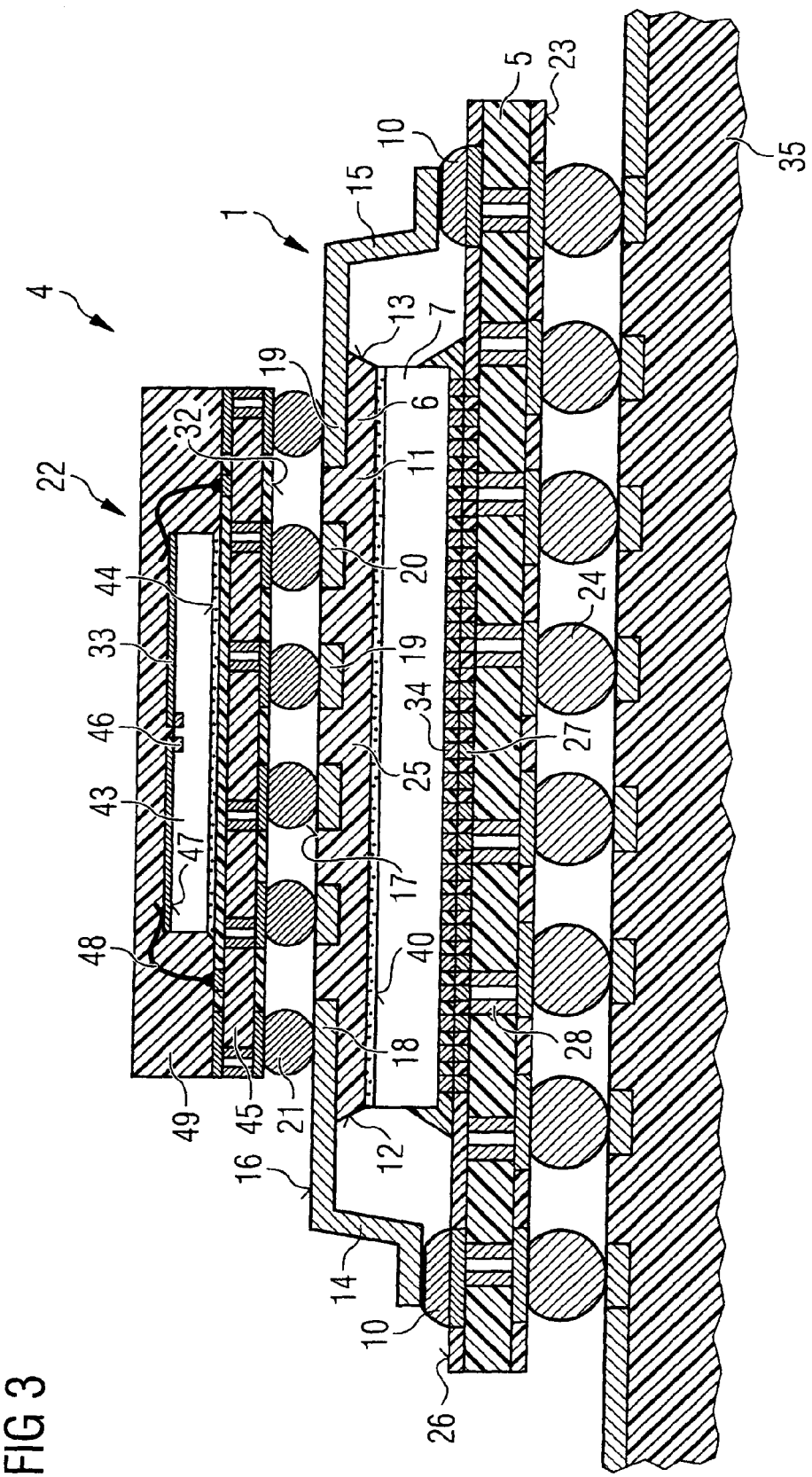
FIG. 3 illustrates a schematic cross section of a semiconductor device stack with a semiconductor base device according to FIG. 2.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "'leading,"'trailing, " etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment provides a semiconductor base device with a wiring substrate and an intermediate wiring board for a semiconductor device stack, and to provide a method for its production. In this respect, the spatial extent of the semiconductor base device is to be reduced in comparison with the aforementioned solutions, and the production costs of the intermediate wiring board are to be reduced. In addition, such a spatially compact semiconductor base device is to have on its upper side external contact patterns which can be adapted to different external contact arrangements of semiconductor devices to be stacked.

According to one embodiment of the invention, a semiconductor base device with a wiring substrate and an intermediate wiring board for a semiconductor device or for a semiconductor module is provided. Arranged between the wiring substrate and the intermediate wiring board is a semiconductor chip, which is electrically in connection with the wiring substrate. While the semiconductor chip is arranged in the center of the upper side of the wiring substrate, the wiring substrate has contact terminal areas in its edge regions. The intermediate wiring board is a self-supporting composite board, on the edge sides of which angled-away external flat conductors are arranged, electrically in connection with the contact terminal areas on the upper side of the wiring substrate. The upper side of this wiring board is made up of an upper side of a plastic package molding compound and upper sides of internal flat conductors. In this case, the upper sides of the plastic package molding compound and the internal flat conductors are arranged in a coplanar manner in relation to each other.

This semiconductor base device has the advantage that a semiconductor device with external contacts of a size and arrangement that are independent of the external contact pattern of the semiconductor base device can be stacked on its upper side with the coplanar-aligned upper sides of the internal flat conductors and the plastic package molding compound. A further advantage is that the intermediate wiring board with the angled-away external flat conductors protruding from the edge regions can be produced with minimal production costs, especially since technologies that are tried and tested in the production of semiconductor devices on the basis of flat conductor frames can be used.

In principle, the intermediate wiring board provides a halved semiconductor device with conventional flat conductor technology, the composite board of the intermediate wiring board representing the lower part of such a standard semiconductor device. While in a standardized semiconductor device based on flat conductor technology there are internal flat conductors which cannot be accessed from the outside, here for the intermediate wiring board access to these internal flat conductors is made possible by forming a coplanar upper side made of plastic package molding compound and upper sides of internal flat conductors.

In one embodiment of the invention, the upper sides of the internal flat conductors have external contact terminal areas. The size and arrangement of these external contact terminal areas correspond to the size and arrangement of external contacts of a semiconductor device to be stacked. This adaptation of the size and arrangement of the external contact terminal areas on the upper side of the intermediate wiring board is accompanied by the advantage that in principle any desired semiconductor device, in particular with a BGA, FBGA or LBGA package, can be stacked on the semiconductor base device.

Furthermore, it is provided that an underside of the wiring substrate that is facing away from the semiconductor chip of the semiconductor base device has external contacts of the semiconductor base device, which are arranged in a distributed manner on the entire underside. This is accompanied by the advantage that the size and arrangement of the external contacts of the semiconductor base device can be adapted customer-specifically to the requirements of a standard of a higher-level circuit board, such as a "motherboard".

Furthermore, the wiring substrate may be a self-supporting insulating board with a wiring structure arranged on its underside and/or on its upper side. In order that the wiring structure can be electrically connected from both sides of the wiring substrate, the wiring substrate has contact vias through the self-supporting insulating board. Such contact vias may be holes through the wiring board that are metallized on their inner walls. One advantage of such a wiring substrate is that, in the form of a wiring strip, it may have a number of semiconductor base device positions, so that joint production steps can be carried out in parallel for a number of semiconductor base devices in mass production.

In a further embodiment of the invention, it is provided that the plastic package molding compound of the intermediate wiring board has a semiconductor chip which is embedded in the plastic package molding compound of the intermediate wiring board in such a way that its contact areas are aligned in a coplanar manner with the upper side of the intermediate wiring board. This has the advantage that the semiconductor chip which is embedded in the intermediate wiring board can be connected to the external contacts of a semiconductor device to be stacked on the base semiconductor device without additional production steps. Furthermore, instead of the semiconductor chip, it is possible to embed a suitable electronic device component such as a resistor, a capacitor or a coil, the electrodes of which are aligned in a coplanar manner with the upper side of the intermediate wiring board, so that these device components are also electrically in connection with a semiconductor device to be stacked on the semiconductor base device.

Furthermore, it is provided that the semiconductor chip between the intermediate wiring board and the wiring substrate has a memory chip, in particular a DRAM (Direct Access Memory) or a flash memory. These types of memory are widespread today and are available as a semiconductor chip with flip-chip contacts, so that the wiring substrate assumes the task of converting the narrowly spaced connection pattern of the flip-chip contacts to a widely spaced connection pattern of a "motherboard". A "narrowly spaced" connection pattern is understood in this context as meaning a center-to-center distance p between the flip-chip contacts of $20 \ \mu m \leq p \leq 120 \ \mu m$ (micrometers). The expression "widely spaced" connection pattern is understood in this context as meaning a center-to-center distance p of about $100 \ \mu m \leq p \leq 1000 \ \mu m$.

In a further embodiment of the invention, the semiconductor chip has a logic device, in one embodiment, a microprocessor. In this case, the semiconductor chip is fixed with its back side on the wiring substrate and its contact areas of the active upper side that are arranged on the edge sides are connected to the wiring structure of the wiring substrate by way of bonding connections. In order to protect the flip-chip contacts of a DRAM or flash memory and/or the bonding connections of a logic device, these components of the semiconductor base device may be embedded in a plastic package molding compound in such a way that the external contacts are arranged on the underside of the semiconductor base device and, on the upper side of the semiconductor base device, the external contact terminal areas for a stacked semiconductor device are accessible and are not covered by plastic package molding compound.

A further embodiment of the invention relates to a semiconductor device stack which has as the lower semiconductor device a semiconductor base device as described above and is electrically in connection with a stacked semiconductor device by way of the external contact terminal areas of the intermediate wiring board of the semiconductor base device. In a further embodiment of such a semiconductor device stack, the upper semiconductor device may have an internal semiconductor chip stack in a plastic package molding compound. The internal semiconductor chip stack is electrically connected to the external contact terminal areas of the semiconductor base device or to the external contact terminal areas of the intermediate wiring board of the semiconductor base device arranged thereunder by way of external contacts on the underside of the semiconductor device. With such an internal semiconductor chip stack, the memory capacity of such a semiconductor device stack having memory chips can be increased correspondingly. Furthermore, it is possible to combine logic devices in the form of logic semiconductor chips with memory semiconductor chips in the internal semiconductor memory, in order to increase the flexibility of the semiconductor device stack.

For this purpose, the semiconductor base device may have a digital signal processor as a semiconductor chip with flip-chip contacts in a BGA, FBGA or LBGA package to apply to a higher-level circuit board. While the semiconductor chip of the semiconductor base device is equipped with flip-chip contacts, the semiconductor base device may have on its upper side an external contact area arrangement for attaching a stacked semiconductor device which likewise has a BGA, FBGA or LBGA package.

If the stacked semiconductor device has an internal chip stack, this may be equipped with an SGRAM or a GRAM as a lower internal semiconductor chip and be electrically connected to a BGA external contact structure and have a flash memory as the upper internal semiconductor chip, the flash memory being arranged with its back side on the active upper side of the lower internal semiconductor chip, in the center. This is a relatively inexpensive solution for combining different types of memory in a semiconductor stack.

A method for producing a semiconductor base device for a semiconductor device stack has the following method steps. Firstly, a wiring substrate strip with a number of semiconductor device positions arranged in rows and/or columns is produced. Subsequently, semiconductor chips are fixed onto the wiring substrate strip in individual semiconductor device positions while leaving edge regions of the wiring substrate strip on the upper side of the wiring substrate strip free. In this case, the semiconductor chip is electrically connected to wiring structures in the semiconductor device positions of the substrate strip.

At a time that is relatively independent of the production of the substrate strip, the intermediate wiring boards may be produced with angled exterior flat conductors on their edge sides and external contact terminal areas on their upper sides. Subsequently, these intermediate wiring boards are applied in the semiconductor device positions of the connecting substrate while connecting the angled-away external flat conductors to wiring structures in the semiconductor device positions. After that, the wiring substrate strip can be divided up into a number of individual semiconductor base devices.

This method has the advantage that producing the intermediate wiring board with angled-away external flat conductors can be carried out at low cost by using tried-and-tested techniques. In addition, the method has the advantage that it creates a semiconductor base device which can receive complete semiconductor devices on its upper side, since it is possible to make the terminal structure of the intermediate wiring board precisely match the semiconductor device to be stacked and in particular the arrangement and size of the external contacts of the semiconductor device to be stacked. Before dividing up the wiring substrate strip, it can be further equipped on its underside with external contacts in the respective semiconductor device positions for the semiconductor base device to be formed. On the other hand, it is also possible to attach the external contacts in the form of solder balls only after the wiring substrate strip has been divided up.

Producing the intermediate wiring board with angled-away external flat conductors can be carried out by the following method steps. Firstly, a flat conductor frame with a number of positions for intermediate wiring boards with corresponding internal flat conductors is produced. The internal flat conductors go over into external flat conductors which can be angled away, the free ends of the internal flat conductors having external contact terminal areas. These external contact terminal areas are adapted in size and arrangement to the size and arrangement of external contacts of a semiconductor device to be stacked. Subsequently, the internal flat conductors are embedded in a plastic package molding compound while leaving the external contact terminal areas free, the external contact terminal areas being aligned in a coplanar manner with an upper side of a plastic package molding compound. After applying the plastic package molding compound, for example by an injection-molding process, the flat conductor frame may be divided up into individual intermediate wiring boards, while angling away the external flat conductors.

This method allows relatively low-cost production and the injection-molding tool for introducing the plastic package molding compound only has to be adapted to the geometry of the intermediate wiring boards. In this case, the flat conductor frame is placed into the injection mold and a number of composite boards are produced on the flat conductor frame in the positions for intermediate wiring boards, mainly including internal flat conductors with their external contact terminal areas and the plastic package molding compound. For injection-molding in the injection mold or the injection-molding tool, the external contact terminal areas of the internal flat conductors are covered, in order as far as possible not to apply any injection-molding compound in the form of plastic package molding compound to the external contact terminal areas that are to be kept free. Should partial or complete coverage of the external contact terminal areas nevertheless occur, the external contact terminal areas can be freed of the remains of plastic package by laser ablation or by appropriate solvents for the plastic package molding compound.

In order to produce a semiconductor device stack for a corresponding semiconductor module, the production of the semiconductor base device can be used as a basis. For this purpose, a further semiconductor device to the intermediate wiring board of the semiconductor base device with its external contact terminal areas, while connecting the external contacts of the semiconductor device to be stacked to the external contact terminal areas of the intermediate wiring board.

To sum up, it can be stated that the present invention provides a novel "lead-frame" construction or a novel flat conductor frame construction for mounting an upper package of a semiconductor device to be stacked. This novel construction includes a half-molded QFP package (quad flat package). For this purpose, the external contact leads in the form of angled-away external flat conductors are mounted on contact terminal areas on a substrate of the lower package or of the semiconductor base device.

The internal flat conductors or "lead fingers" serve as external contact terminal areas for the upper package. For this purpose, an intermediate wiring carrier in the form of the half-molded QFP package is mounted on the substrate of the lower package by a conventional SMT method (surface mounting technique). Soldering methods or else adhesive techniques may be used for the mounting. For mechanical stabilization, the molded underside of the intermediate wiring board may be adhesively bonded on the upper side of a semiconductor chip which is located between the intermediate wiring board and a wiring substrate. Since the intermediate wiring board is dimensionally stable, it can also be mounted in a self-supporting manner on the wiring substrate of the base package. During the injection-molding of the intermediate wiring carrier, the surfaces to be protected are protected in a sealing manner by an adhesive film before the plastic package molding compound is injected onto the flat conductor frame.

To sum up, the following advantages of the invention are obtained:

1. The lower package may be constructed by standard FCIP (flip chip in package) technology or by a BGA technique or, with only minor modifications, by an FBGA technique. All that is required for this is that corresponding free areas of the necessary contact terminal areas are provided in the edge region of a wiring substrate.

2. The mounting of the intermediate wiring board may be performed by conventional SMT processes, which are established methods with a high yield.

3. The contact pattern for the top package is largely freely and flexibly selectable. The usual design rules of flat conductor frame structuring are adequate for the necessary contact spacings.

4. When the subject matter of the invention is used, pre-mounting of the entire construction is possible. However, this pre-mounting may only be carried out at the premises of the customer intending to stack semiconductor devices.

5. The intermediate wiring board, which is also referred to as the intermediate carrier, can be produced at low cost by using the flat conductor frame technique or "leadframe technique".

6. An additional device can be integrated in the plastic package molding compound of the intermediate wiring carrier.

FIG. 1 illustrates a schematic cross section through an intermediate wiring board 6 of a flat conductor frame 36 with angled-away external flat conductors 14 and 15. These external flat conductors 14 and 15 protrude from the edge sides 12 and 13 of the intermediate wiring board 6. The intermediate wiring board 6 itself is self-supporting and has been molded from plastic package molding compound 25 by an injection-molding compression process. Used for this purpose was an injection-molding tool, which simultaneously produces a number of such intermediate wiring boards 6, which are joined together by way of the flat conductor frame 36.

For this purpose, internal flat conductors 19 are aligned in such a way that they form a coplanar surface area with their upper sides 18 and with the upper side 17 of the plastic package molding compound. The internal flat conductors 19 go over into the external flat conductors 14 and 15 and have at their ends that are partially embedded in the plastic molding compound freely accessible external contact terminal areas 20, which are aligned in a coplanar manner with the upper side 17 of the plastic package molding compound 25 and, with the plastic package molding compound 25, form a composite board 11. This composite board 11 is distinguished by the fact that the size and arrangement of the external contact terminal areas 20 arranged on the upper side 16 can be adapted to any desired size and arrangement of external contacts of semiconductor devices to be stacked and that production methods which have been tried and tested in semiconductor technology can be used for this purpose.

Depending on the thickness of the plastic package molding compound 25, further components may also be integrated in the intermediate wiring board 6, forming with their electrodes the external contact terminal areas 20 of the intermediate wiring board 6. This is of particular interest for the additional embedding of discrete capacitors or resistors in the plastic package molding compound 25 of the intermediate wiring board 6, for example for output impedance matching of the semiconductor base device.

FIG. 2 illustrates a schematic cross section of a semiconductor base device 1 according to a first embodiment of the invention. Components with the same functions as in FIG. 1 are identified by the same designations and are not separately explained.

The semiconductor base device 1 illustrated in FIG. 2 has the intermediate wiring board 6 illustrated in FIG. 1, which, with its upper side 16 and the external contact terminal areas 20 arranged there, forms the upper side 16 of the semiconductor base device 1. The underside 23 of the semiconductor base device 1 is at the same time also the underside 23 of the wiring substrate 5, the underside 23 having external contact pads 37 of the semiconductor base device 1. These external contact pads 37 have external contacts 24 of the semiconductor base device 1 and at the same time external contacts 24 on the wiring substrate 5.

These external contacts 24 are connected by way of contact vias 28 to contact terminal areas 10, which are arranged in the edge regions 8 and 9 of the upper side 26 of the wiring substrate 5. Fixed onto these contact terminal areas 10 are the external flat conductors 14 and 15 of the intermediate wiring board 6 illustrated in FIG. 1. Consequently, the external contact areas 20 on the upper side 16 of the semiconductor base device 1 are electrically connected to the external contacts 24 on the underside 23 of the semiconductor base device 1.

Arranged between the intermediate wiring board 6 and the wiring substrate 5 in this first embodiment of the invention is a semiconductor chip 7 with flip-chip contacts 34, which are electrically in connection likewise with the external contacts 24 on the underside 23 of the semiconductor base device 1 by way of a wiring structure 27 of the wiring substrate 5 and with the external contact terminal areas 20 on the upper side 16 of the semiconductor base device 1 by way of the intermediate wiring board 6.

The flip-chip contacts 34 of the semiconductor chip 7 are protected from mechanical damage by a layer 38 of underfilling material, an "underfiller", thermal stresses being mitigated by this plastic. Arranged between an underside 39 of the intermediate wiring board 6 and the back side 40 of the semiconductor chip 7 is an adhesive layer 41, which imparts stability to the semiconductor base device. A package contour 42, which can be realized if the semiconductor base device 1 that is illustrated is to be additionally protected by a plastic package molding compound, is indicated by a dashed line. In this embodiment of the invention, the semiconductor chip 7 is a GDRAM memory for a graphics card and has a memory capacity of several gigabits.

FIG. 3 illustrates a schematic cross section of a semiconductor device stack 4 with a semiconductor base device 1 according to FIG. 2. Components with the same functions as in the previous figures are identified by the same designations and are not separately explained.

The available ends of the internal flat conductors 19 on the upper side 16 of the semiconductor base device 1 are designed here as external contact terminal areas 20 and are adapted in their size and arrangement to the size and arrangement of external contacts 21 on the underside 30 of the stacked semiconductor device 22. The external contacts 21 of the stacked semiconductor device 22 are formed on corresponding external contact areas on the underside 32 of the stacked semiconductor device 22. While the semiconductor chip 7 of the semiconductor base device 1 is a semiconductor chip 7 with flip-chip contacts 34, the stacked semiconductor device 22 has a semiconductor chip 43, which is arranged with its back side 44 on a wiring substrate 45 and has a bonding channel 46 on its active upper side 47. From the central bonding channel 46, interconnects 33 extend to the edge regions of the semiconductor chip 43, bonding connections 48 electrically connecting the semiconductor chip 43 to the wiring substrate 45. To protect the bonding connections 48 and the semiconductor chip 43, the stacked semiconductor device 22 is embedded in a plastic package molding compound 49 of the stacked semiconductor device 22. The semiconductor device stack may be connected to a higher-level circuit board 35 by way of the external contacts 24 in a BGA arrangement.

With this exemplary embodiment of the invention in the form of a semiconductor chip stack 4, it is illustrated that, by using the intermediate wiring board 6, any desired semiconductor devices in quite different inner and outer constructions and packages can be combined at low cost and reliably to form a semiconductor device stack 4 or semiconductor module.

FIG. 4 illustrates a schematic cross section of a semiconductor base device 2 according to a second embodiment of the invention. The difference from the semiconductor base device 1 of the first embodiment of the invention, as illustrated in FIG. 2, is that the intermediate wiring board 6 is arranged in a self-supporting manner while fixing the angled-away external contacts 14 and 15 on the contact terminal areas 10 of the wiring substrate 5 and is not connected by an adhesive layer between the composite body 11 of the intermediate wiring board 6 and the upper side of the semiconductor chip arranged thereunder.

Furthermore, the second exemplary embodiment illustrates that, instead of a semiconductor chip with flip-chip contacts, a memory chip 51 with a central bonding channel 46 and an internal wiring structure 50 on the active upper side 47 of the semiconductor chip 51 may also be connected to the wiring substrate 5 of the semiconductor base device 1 by way of bonding connections 48. In this case, no underfilling material is required, since the semiconductor chip 51 can be fixed with its back side 44 directly on the wiring substrate 5. However, to protect the bonding connections 48 and the semiconductor chip 51, and also the bonding channel 46, these components of the semiconductor base device 2 are embedded in a plastic package molding compound 49.

FIG. 5 illustrates a schematic cross section of a semiconductor base device 3 according to a third embodiment of the invention. The third embodiment of the invention differs from the previous embodiments of the invention in that a further device component 29 is embedded in the composite board 11, and there in particular in the plastic package molding compound 25, forming with its electrodes 30 external contact terminal areas 20 for a semiconductor device to be stacked. If a semiconductor chip is used as the additional device component 29, its contact areas 31 may be connected to the internal flat conductors 19 of the intermediate wiring board 6. This third embodiment of the invention is used with preference whenever passive circuit elements, such as capacitors, resistors or coils, are to be additionally installed in the semiconductor base device, for example for impedance matching.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a wiring substrate;
   an intermediate wiring board for a semiconductor device stack;
   a semiconductor chip arranged between the wiring substrate and the intermediate wiring board, electrically in connection with the wiring substrate; and
   the wiring substrate comprising contact terminal areas on an upper side and edge regions, the intermediate wiring board being a self-supporting composite board, on the edge sides of which angled-away external flat conductors are arranged, the upper side of the composite board being made up of an upper side of a plastic package molding compound and of upper sides of internal flat conductors which extend from the external flat conductors, wherein the entire upper sides of the internal flat conductor remain free of the plastic package molding compound and form external contact areas of the semiconductor device, wherein the entire upper sides of the internal flat conductors and the upper side of the plastic package molding compound are coplanar with one another to form the upperside of the composite board, wherein an underside of the wiring substrate that is facing away from the semiconductor chip comprises external contacts of the semiconductor device which are arranged in a distributed manner on the entire underside, wherein an upperside and the underside of the wiring substrate comprises a wiring structure which is electrically connected to contact vias through the wiring substrate, and wherein the angled-away external flat conductors of the intermediate wiring board are coupled to the contact terminal areas of the wiring substrate so that the external contact areas of the semiconductor device on the upperside of the composite board are in electrical contact with the semiconductor chip and the external contacts of the semiconductor device on the underside of the wiring substrate via the wiring structure and contact vias.

2. The device as claimed in claim 1, comprising wherein the internal flat conductors go over into the external flat conductors and the angled-away external flat conductors are electrically in connection with the contact terminal areas on the edge regions of the wiring substrate.

3. The device as claimed in claim 1, wherein the external contact areas formed by the upper sides of the internal flat conductors have a size and arrangement which correspond to a size and arrangement of external contacts of a semiconductor device to be stacked thereon.

4. The device as claimed in claim 1, comprising wherein embedded in the plastic package molding compound of the intermediate wiring board is a semiconductor chip, the contact areas of which are aligned in a coplanar manner with the upper side of the intermediate wiring board.

5. The device as claimed in claim 1, comprising wherein embedded in the plastic package molding compound of the intermediate wiring board is a passive electronic device component, the electrodes of which are aligned in a coplanar manner with the upper side of the intermediate wiring board.

6. The device as claimed in claim 1, wherein the semiconductor chip comprises a memory chip.

7. The device as claimed in claim 1, wherein the semiconductor chip comprises a logic device.

8. A semiconductor device comprising:
a wiring substrate including contact terminal areas on an upper side and edge regions;
a semiconductor chip electrically connected to contact terminal areas on the wiring the wiring substrate; and
an intermediate wiring board including flat internal conductors, flat external conductors, and a composite board of a plastic package molding compound, wherein the external flat conductors are arranged on the edge sides and angled-away from the composite board, a first end of the external flat conductors being coplanar with the plastic package molding compound to form an upper surface of the composite board and which serve as external contact areas of the semiconductor device to which another semiconductor chip is to be connected, and a second end of the external flat conductors are connected to the contact terminal areas on the edge regions of the wiring substrate such that the composite board is self-supporting above the wiring substrate and positioned such that the first semiconductor chip is disposed between a lower surface of the composite board and the wiring substrate wherein the entire upper surface of the first end of the external flat conductors is coplanar with the upper surface of the composite board, wherein an underside of the wiring substrate that is facing away from the semiconductor chip comprises external contacts of the semiconductor device which are arranged in a distributed manner on the entire underside, wherein an upperside and the underside of the wiring substrate comprises a wiring structure which is electrically connected to contact vias through the wiring substrate, and wherein the angled-away external flat conductors of the intermediate wiring board are coupled to the contact terminal areas of the wiring substrate so that the external contact areas of the semiconductor device on the upperside of the composite board are in electrical contact with the semiconductor chip and the external contacts of the semiconductor device on the underside of the wiring substrate via the wiring structure and contact vias.

* * * * *